United States Patent [19]
Honjo et al.

[11] Patent Number: 5,218,448
[45] Date of Patent: Jun. 8, 1993

[54] SIGNAL REPRODUCING APPARATUS

[75] Inventors: Masahiro Honjo, Neyagawa; Hiroshi Taniguchi, Hirakata; Kunihiko Hontani, Settsu, all of Japan

[73] Assignee: Matsushita Electric Industrial Co., Ltd., Osaka, Japan

[21] Appl. No.: 626,298

[22] Filed: Dec. 12, 1990

[30] Foreign Application Priority Data

Dec. 15, 1989 [JP] Japan .................................. 1-326331
Dec. 15, 1989 [JP] Japan .................................. 1-326332
Jun. 5, 1990 [JP] Japan .................................. 2-148274

[51] Int. Cl.$^5$ .................................................. H04N 9/79
[52] U.S. Cl. .................................. 358/328; 358/327; 358/341; 358/330
[58] Field of Search ............... 358/310, 315, 319, 320, 358/323, 327, 328, 335, 336, 337, 340, 341, 343, 316, 318, 330, 36, 167, 23

[56] References Cited
U.S. PATENT DOCUMENTS

| | | | |
|---|---|---|---|
| 4,878,128 | 10/1989 | Yasamura et al. | 358/315 |
| 4,908,581 | 3/1990 | Honjo | 329/320 |
| 4,998,172 | 3/1991 | Kitazawa et al. | 358/328 |
| 5,063,452 | 11/1991 | Higurashi | 360/19.1 |

FOREIGN PATENT DOCUMENTS 58-203605 11/1983 Japan .
59-29992 7/1984 Japan .

Primary Examiner—Tommy P. Chin
Assistant Examiner—Robert Chevalier
Attorney, Agent, or Firm—Wenderoth, Lind & Ponack

[57] ABSTRACT

A signal reproducing apparatus reproduces a video signal from a recording medium in which a first modulation signal has a video signal frequency-modulated at carrier frequency fc and a second modulation wave has a second signal modulated in a lower frequency region than the frequency fc. A frequency demodulation circuit for frequency-demodulates a first modulation wave and subtracts the cross modulation interference generated in the demodulation signal depending on the output from a detecting circuit. A first filter separates the second modulation wave from the reproduced signal. A detecting circuit detects the cross modulation interference component remaining in the demodulation signal in a specified period from the output signal of the first filter and the output of the demodulation circuit. A closed loop for controlling the frequency demodulation circuit by the output of the detecting circuit is composed, so that the cross modulation interference component in the frequency demodulation signal in the frequency demodulation circuit is removed.

33 Claims, 7 Drawing Sheets

FIG. 7
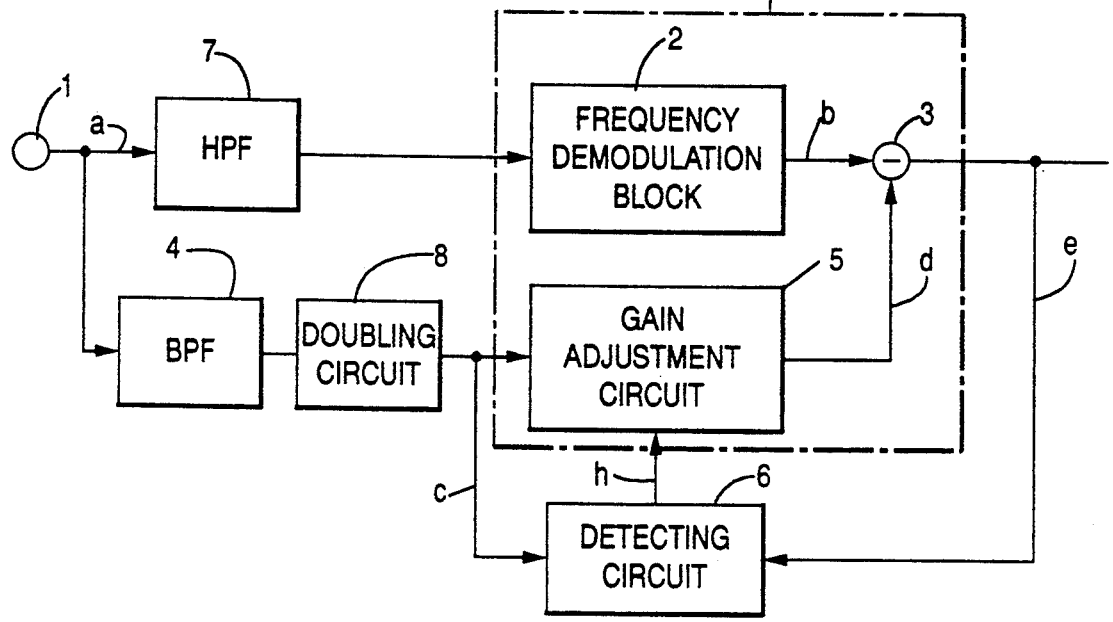
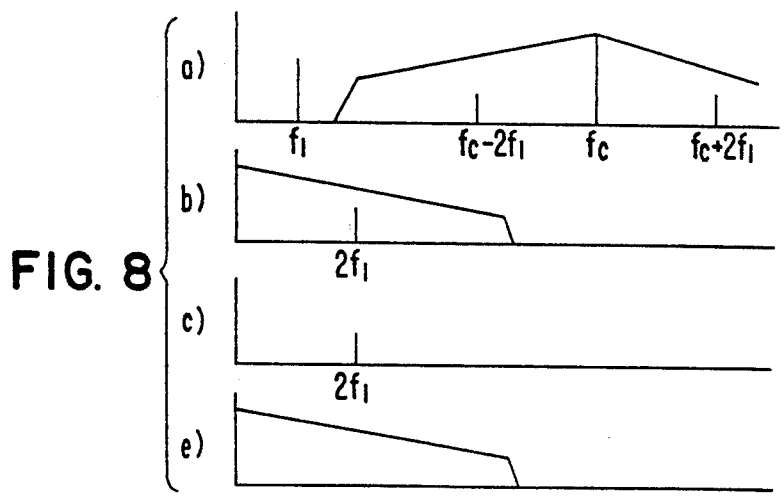
FIG. 8

SIGNAL REPRODUCING APPARATUS

BACKGROUND OF THE INVENTION

1. Field of the Invention

The present invention relates to a signal reproducing apparatus for removing cross modulation interference components caused by secondary distortion or tertiary distortion generated during recording and operations in a video disc system, a video tape recorder or the like.

2. Description of the Prior Art

In a video disc system, when reproducing a video FM signal after, cross modulation occurs between a video FM modulation wave fc and an audio FM modulation wave $f_1$ superposed in the low band. In particular, a cross modulation component caused by secondary distortion $fc + f_1$ is demodulated as an interference signal of frequency $f_1$ in the deteriorates video signal, which deteriorated the reproduced picture quality significantly.

Hitherto, various methods have been proposed for removing the cross modulation component $f_1$. For example, a method disclosed in the Japanese Patent Publication No. 59-29992 reduces the cross modulation interference by subtracting the audio modulation signal from the demodulated video signal.

Alternately, according to the Japanese Laid-open Patent No. 58-203605, the reproduced video FM signal is further phase-modulated to reduce the cross modulation interference.

In these prior art methods, however, there is no practical is disclosure directed to a method of adjusting the subtraction level when eliminating the cross modulation components.

Actually, the cross modulation level differs significantly from one disk to other, and even in a same disk, the cross modulation level varies between the outer circumference and inner of the disk circumference. As such, the cross modulation can not be satisfactorily removed in the conventional methods, and in some instances the cross modulation interference is increased.

Further, in the magnetic recording and reproducing apparatus such as the video tape recorder, a tertiary distortion occurs which is theoretically caused by the electromagnetic conversion characteristic. The same problems described above are encountered in removal of cross modulation interference caused by tertiary distortion.

SUMMARY OF THE INVENTION

It is hence a primary object of the invention to present a signal reproducing apparatus capable of satisfactorily and stably removing secondary or tertiary cross modulation interference.

To achieve the above object, the present invention provides a signal reproducing apparatus for reproducing a video signal from a recording medium having recorded therein a mixed signal of a first modulation wave having a video signal frequency-modulated by a carrier frequency fc, and a second modulation wave having a second signal modulated in a lower frequency region than said frequency fc, which comprises:

frequency demodulation means for frequency-demodulating the first modulation wave, and having means for reducing the cross modulation interference generated in the demodulated signal depending on an output from detecting means;

first filter means for separating the second modulation wave from the reproduced signal; and the detecting means for detecting a cross modulation interference component remaining in the demodulated signal in a specified period from an output signal of the first filter means and an output of the frequency demodulation means, wherein a closed loop for controlling the frequency demodulation means by the output of the detecting means is composed so as to remove the cross modulation interference components in the frequency demodulated signal of the output of the frequency demodulation means.

A preferred signal reproducing means comprises:

frequency demodulation means for frequency-demodulating the first modulation wave, first filter means for separating the second modulation signal from the reproduced signal;

gain adjusting means for adjusting the gain of an output signal of the first filter means by information from a detecting means;

subtracting means for subtracting an output signal of the gain adjusting means from an output of the demodulation means; and the detecting means for detecting the second modulation wave component remaining in an output signal of the subtracting means in a specified period by feeding the output signal of the subtracting means and the output signal of the first filter means, wherein a closed loop for controlling the gain adjusting means by the output of the detecting means is composed so as to remove the second modulation wave component in the frequency demodulated signal of the output of the subtracting means.

Another preferred signal reproducing apparatus comprises:

frequency demodulation means for frequency-demodulating the first modulation wave;

first filter means for separating the second modulation wave from the reproduced signal;

doubling means for doubling the frequency of an output signal of the first filter means;

gain adjusting means for adjusting the gain of an output signal of the doubling means by information from a detecting means;

subtracting means for subtracting an output signal of the gain adjusting means from an output of the demodulation means and the detecting means for detecting the double frequency component of the second modulation wave remaining in an output signal of the subtracting means in a specified period by feeding the output signal of the subtracting means and the output signal of the doubling means, wherein a closed loop for controlling the gain adjusting means by the output of the detecting means is composed so as to remove the double frequency component of the second modulation wave in the frequency demodulated signal of the output of the subtracting means.

A further different preferred signal reproducing apparatus comprises:

frequency demodulation means capable of controlling the limiter balance for frequency modulating the first modulation wave;

a first filter for separating the second modulation wave from the reproduced signal; and detecting means for detecting the second modulation wave component remaining in a specified period of an output signal of a frequency demodulation circuit by feeding the output signal of the frequency demodulation circuit and an output signal of the first filter, wherein a closed loop for controlling the limiter balance of the frequency demodulation circuit by the output of the detecting means is composed so as to suppress the second modulation wave component occurring in the frequency demodulated signal of the output of the frequency demodulation circuit.

Another preferred signal reproducing apparatus comprises:

frequency demodulation means for frequency-demodulating the first modulation wave;

a first filter for separating the second modulation wave from the reproduced signal; and detecting means for detecting the second modulation wave component remaining in an output signal of the frequency demodulation means in a specified period by feeding the output signal of the frequency demodulation means and an output signal of the first filter, wherein the frequency demodulation means comprises a limiter circuit for limiting the first modulation wave, a first pulse generation circuit for generating a pulse of a specific width in response to a rising edge of an output signal of the limiter circuit, a second pulse generation circuit for generating a pulse of a specific width in response to a falling edge of the output signal of the limiter circuit, and an adder circuit capable of controlling the addition ratio for adding outputs of the first and second pulse generation circuits at a specific ratio, and wherein a closed loop for controlling the addition ratio of the adder circuit of the frequency demodulation means by the output of the detecting means is composed so as to suppress the second modulation wave component occurring in the frequency demodulated signal of the output of the frequency demodulation means.

In the above constitution, the cross modulation components existing in the flat portion of the video signals in the horizontal or vertical synchronous signal interval are detected, and the video signal itself is not interfered. It is thus possible to accurately adjust the subtraction level of the cross modulation components to be subtracted, or the limiter level or mixing level for suppressing the cross modulation interference. Moreover, since a feedback loop is composed, it does not matter if the discs are different or the cross modulation levels are different between the outer circumference and inner circumference of a same disc.

Still more, it is not intended that the signals of high frequency region near the video FM signal fc be processed, but it is possible to process at a low frequency of subtracting the frequency component $f_1$ or $2f_1$ from the video frequency modulation signal, and therefore the phase adjustment and other operations are very easy, and a stable operation is realized.

BRIEF DESCRIPTION OF THE DRAWINGS

FIG. 7 is a block diagram of a second embodiment of a signal reproducing apparatus of the invention, FIG. 8 is a spectrum diagram of parts in FIG. 7.

DESCRIPTION OF THE PREFERRED EMBODIMENTS

Figure 1:
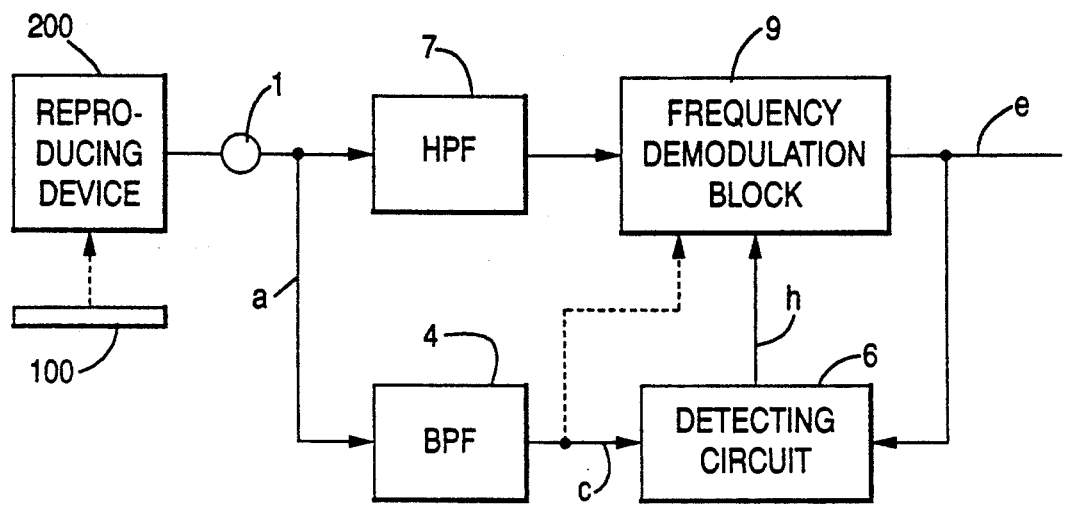
FIG. 1 is a block diagram showing a general composition of a signal reproducing apparatus of the invention.

FIG. 1 is a block diagram showing a general structure of a signal reproducing apparatus capable of removing cross modulation caused by secondary distortion. A recording medium 100 is an optical disc, magnetic disc, magnetic tape or the like, which records a mixed signal of a first distortion wave having a video signal frequency-modulated at carrier frequency fc and a second modulation wave having an audio signal frequency-modulated in a frequency region ($f_1$) lower than fc. A reproducing device 200 is, for example, an optical head or magnetic head, which reproduces the mixed signal from the recording medium 100, and obtains a reproduced FM signal.

A reproduced FM signal a containing secondary distortion coming in form the reproducing device 200 through an inputer terminal 1 is passed through a high-pass filter (HPF) 7, and is frequency-demodulated in a frequency demodulation block 9, and a signal e is obtained.

A band-pass filter (BPF) 4 separates an audio modulation signal c from the signal a. A detecting circuit 6 accurately detects a cross modulation component $f_1$ contained in the signal e using the output signal e of the frequency demodulation block 9 and the output signal of the BPF 4, and controls the frequency demodulation block 9 using a signal h so as to minimize the residual component.

Here, the frequency modulation block 9 may receive the output of the BPF (indicated by broken line), in addition to the outputs of the HPF 7 and detecting circuit 6.

Figure 2:
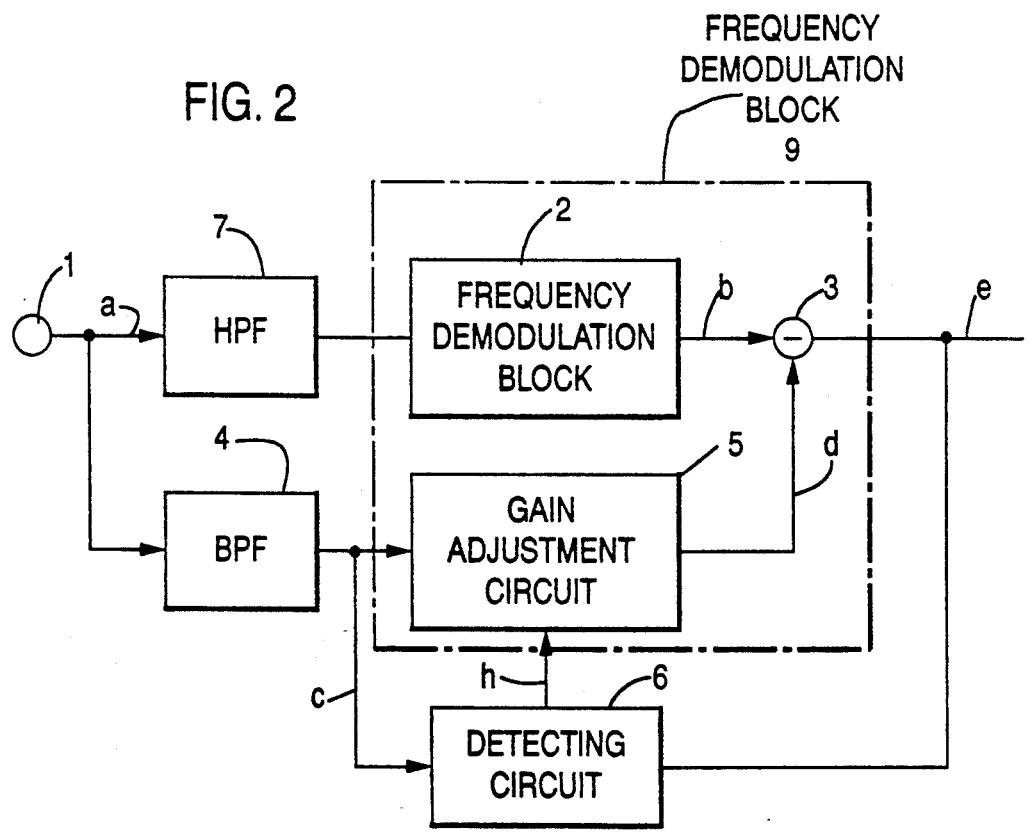
FIG. 2 is a block diagram of a first embodiment of a signal reproducing apparatus of the invention.
Figure 3:
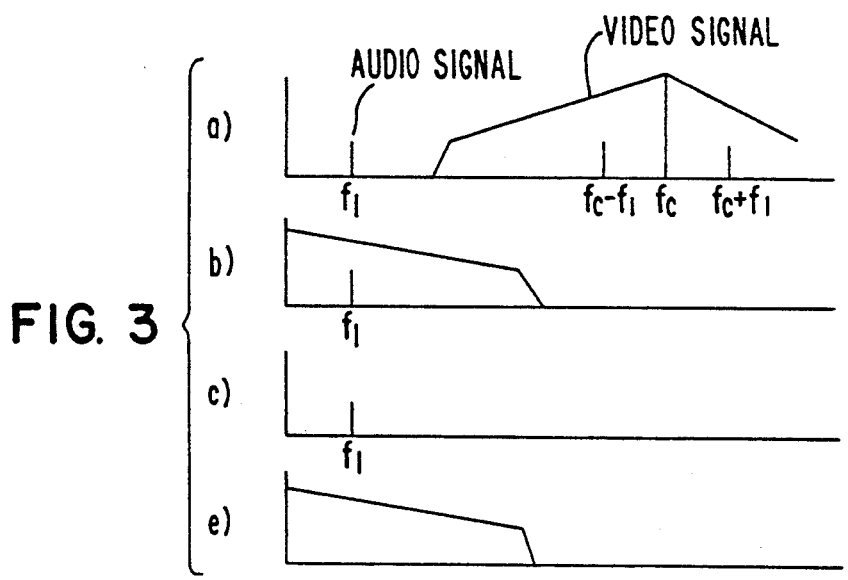
FIG. 3 is a spectrum diagram of parts in FIG. 2.

FIG. 2 is a block diagram of a first embodiment of a signal reproducing apparatus capable of removing the cross modulation caused by secondary distortion, and FIG. 3 shows a signal spectrum diagram corresponding to the parts in FIG. 2.

The reproduced FM signal a containing secondary distortion coming in from the input terminal 1 is passed through the high-pass filter (HPF) 7 and is frequency-demodulated in a frequency demodulation circuit 2 in the frequency demodulation block 9 to obtain a signal b. The audio modulation signal c separated from the signal a by the band-pass filter (BPF) 4 is adjusted to a optimum gain in a gain adjusting circuit 5 according to the output signal h from the detecting circuit 6 to obtain a signal d. By subtracting the signal d from the demodulated signal b in a subtracting circuit 3, an output signal e is obtained. The detecting circuit 6 accurately detects the cross modulation component $f_1$ contained in the signal e from the output signal c of the BPF 4 and the output signal e of the subtracting circuit 3, and creates a signal h for controlling the gain adjusting circuit 5. The frequency demodulation block 9 is composed of frequency demodulation circuit 2, gain adjusting circuit 5 and subtracting circuit 3. In FIG. 3, fc is the carrier frequency of the FM video signal, and $f_1$ is the frequency of the audio modulation signal.

Figure 4:
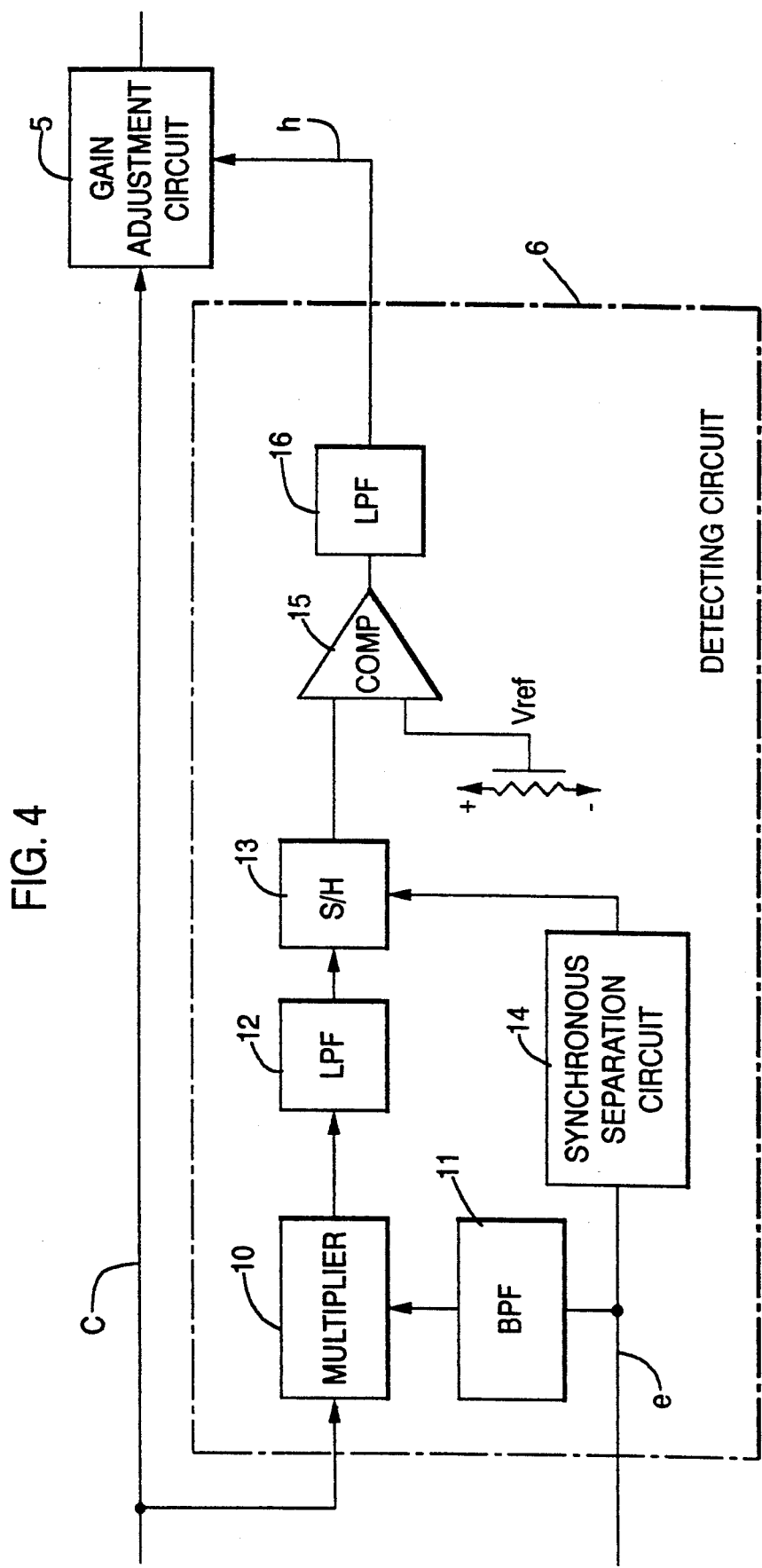
FIG. 4 is a block diagram showing a first embodiment of a detecting circuit.

A constituent example of the detecting circuit 6 is shown in FIG. 4.

The output of the BPF 11 for filtering the cross modulation frequency component $f_1$ contained in the demodulated output signal e and the signal c which is the output of the BPF 4 are multiplied in a multiplier 10. Here, the DC component of the output of the multiplier is positive, for example, if the signal c and signal e are in phase, negative if out of phase, and zero if there is no $f_1$ component in signal e.

From the output of the multiplier 10, the DC component is taken out by the LPF 12. Here, by detecting the cross modulation in the segment of the demodulated signal e free from the video signal, the detection precision of detection may be substantially enhanced. In other words, the horizontal synchronous signal or vertical synchronous signal is separated in the synchronous separation circuit 14 using the demodulated signal e, and the output of the LPF 12 in the synchronous signal segment is held in a sample hold circuit (S/H) 13. The sample-held voltage is compared with a reference voltage Vref (for example, zero) in a comparator (COMP) 15, and depending on the difference, the output signal of the comparator 15 is delivered to the gain adjusting circuit 5 a signal h through the LPF 16 so as to increase or decrease the level of the gain adjusting circuit 5.

The gain adjusting circuit 5 may be composed of a multiplier, for example. Alternately the gain adjusting circuit 5 may be controlled at the output level of the S/H 13, and in such a case, the comparator 15 and the LPF 16 may be omitted.

In this composition, since the output of the sample hold circuit 13 is fed back and controlled so as to be always the same as the reference potential, and substantially the DC output level of the multiplier 10 is controlled, the cross modulation component $f_1$ existing in the demodulated signal e may be removed.

Figure 5:
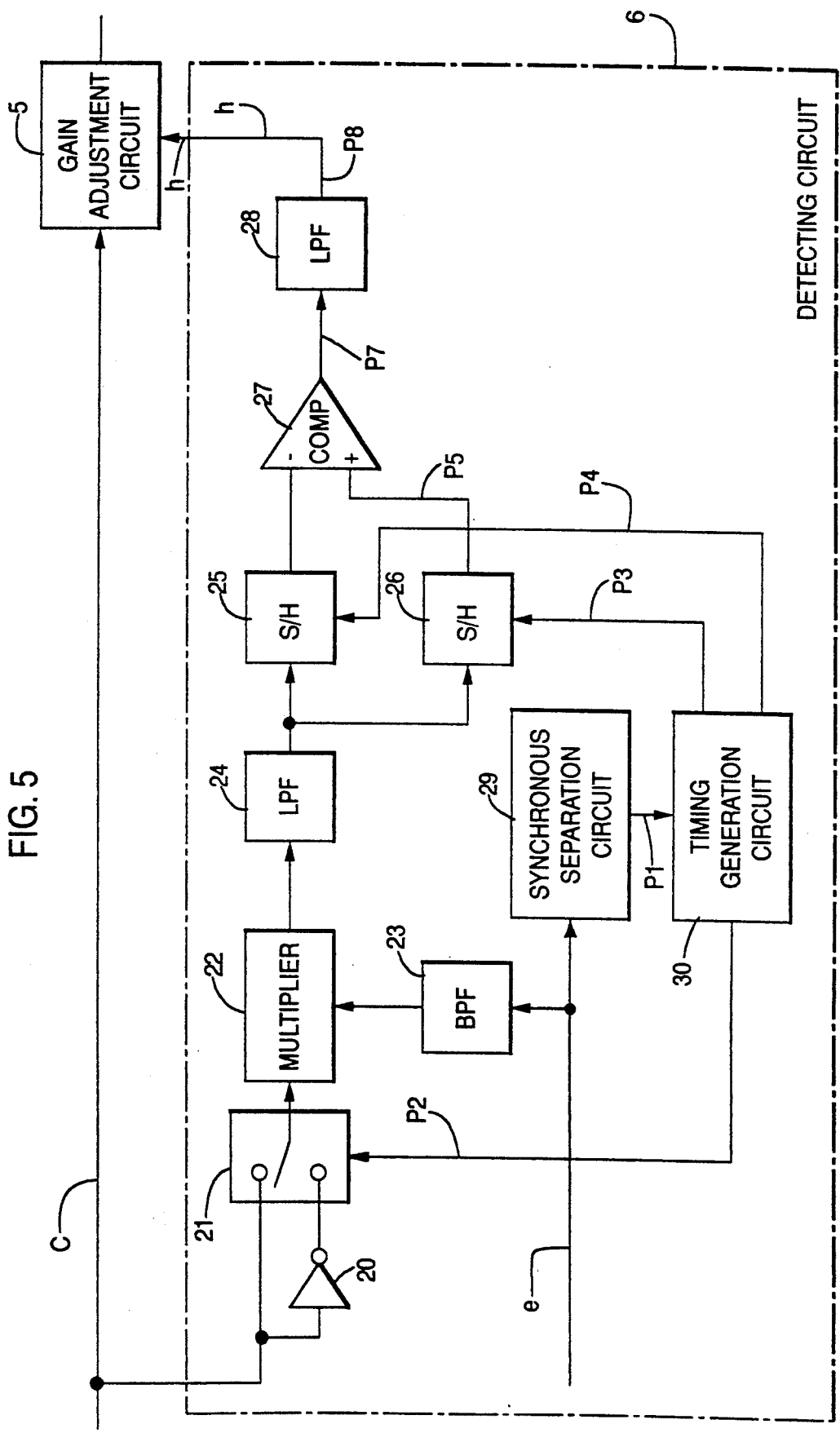
FIG. 5 is a block diagram showing a second embodiment of a detecting circuit.

Another composition of the detecting circuit 6 is shown in FIG. 5.

The output signal c of the BPF 4 is fed to an inverting circuit 20, and is also fed in a switch circuit 21. Responsive to a command from the timing generation circuit 30, the signal c and the output signal of the inverting circuit are alternately changed over at intervals of one horizontal synchronizing period or one vertical synchronizing period, and the output is delivered to a multiplier 22.

The output signal e of the subtracting circuit 3 is passed through a BPF 23 for filtering cross modulation component $f_1$ and then applied to the multiplier 22. If the cross modulation component $f_1$ is present in the output of the BPF 23, the DC output level of the multiplier 22 will possess a positive or negative step difference alternatively in every specified period. As the cross modulation component $f_1$ becomes smaller, the DC step difference also becomes smaller, and when the cross modulation component is completely removed, the DC step difference becomes zero. Accordingly, the feedback control is effected so as to render this DC step difference zero.

Figure 6:
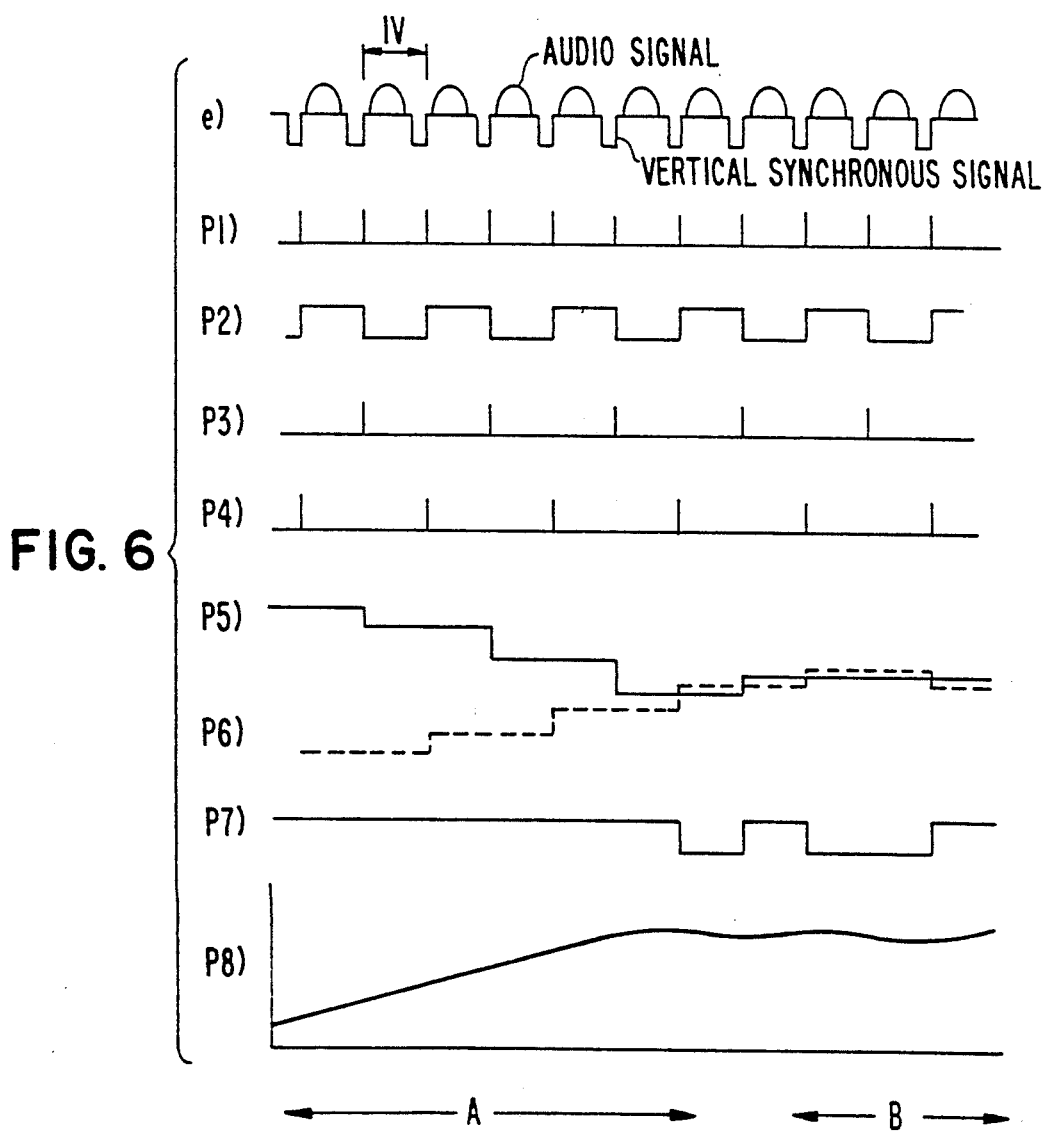
FIG. 6 is waveform diagram of parts in FIG. 5.

The DC component of the multiplier 22 is taken out in the LPF 24 and is alternately held in specified periods in sample hold circuits (S/H) 25, 26. The potentials of the outputs of the sample hold circuit 25, 26 are compared in a comparator (COMP) 27, and a control signal is delivered. The control signal is delivered to the gain adjusting circuit 5 through a LPF 28. A timing generation circuit 30 generates a specified timing on the basis of a synchronous signal from a synchronous separation circuit 29. FIG. 6 depicts waveforms of the output signal e and parts P1 to P8 shown in FIG. 5.

In the synchronous signal separation circuit 29, suppose the vertical synchronous signal is separated from signal e. It may be also a horizontal synchronous signal, which does not matter. By the pulse P1 indicating this vertical synchronous signal, pulses of P2, P3, P4 are generated in the timing generation circuit 30. In the segment A where the cross modulation level is not removed, the DC output level of the multiplier 22 produces a step difference in every period of P3, and it is signals P5, P6 that are obtained by holding alternately with pulses P3, P4. Signal P5 (solid line) is fed into + terminal of comparator 27, and P6 (broken line) to terminal of comparator 27. As a result, the output of the comparator 27 becomes P7, and the output of the LPF 28 is controlled in the direction of removing the cross modulation as indicated by P8, thereby reaching the stability point shown in segment B. P8 is signal h.

In this detecting circuit, since the characteristic changes caused by temperature variations of elements can be absorbed, an extremely stable cross modulation removal is realized.

FIG. 7 shows a block diagram of a second embodiment of a signal reproducing apparatus of the invention capable of removing cross modulation caused by tertiary distortion, and FIG. 8 shows a signal spectrum diagram corresponding to the parts shown in FIG. 7.

A reproduced FM signal a containing tertiary distortion coming in from an input terminal 1 is passed through a high-pass filter (HPF) 7, and frequency-demodulated in a frequency demodulation circuit 2 of a frequency demodulation block 9, and a signal b is obtained. On the other hand, the audio modulation signal separated from the signal a by a band-pass filter (BPF) 4 is doubled in frequency in a doubling circuit 8 to obtain signal c. The signal c is adjusted to an optimum gain in a gain adjusting circuit 5 according to a signal h from a detecting circuit 6 to obtain a signal d. The signal d is subtracted from demodulated signal b in a subtracting circuit 3 to obtain an output demodulated signal e. The detecting circuit 6 is to accurately detect the cross modulation component 2f contained in the signal e from the output signal c of the doubling circuit 8 and the output signal e of the subtracting circuit 3, and to control the gain adjusting circuit 5. The doubling circuit 8 is composed of, for example, a multiplier and band-pass filter. The composition of frequency demodulation block 9 and the composition and operation of detecting circuit 6 are as described above.

Figure 9:
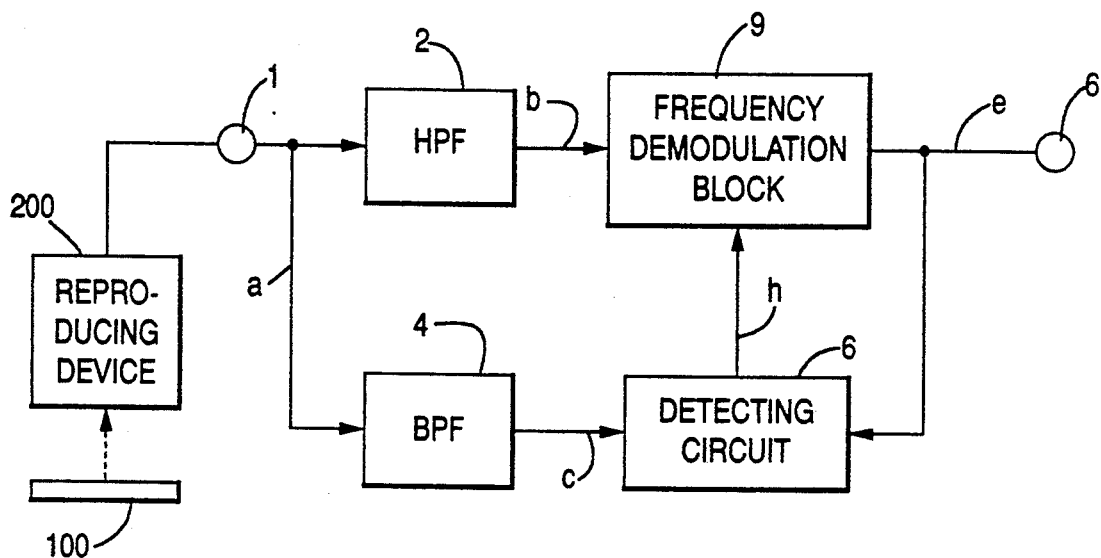
FIG. 9 is a block diagram of a third embodiment of a signal reproducing apparatus of the invention.
Figure 10:
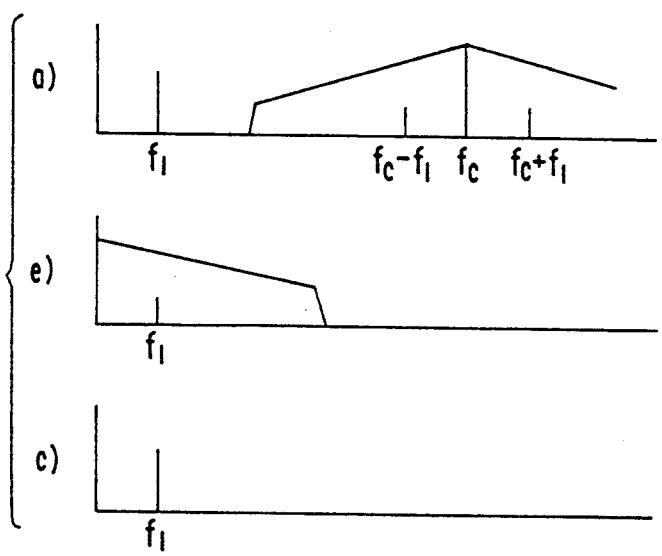
FIG. 10 is a spectrum diagram of parts in FIG. 9.

FIG. 9 shows a block diagram of a third embodiment of the invention, and FIG. 10 shows signal spectra of parts shown in FIG. 9.

A reproduced FM signal containing secondary distortion coming in from an input terminal 1 is passed through a high-pass filter (HPF) 7 to obtain signal b, and is frequency-demodulated at carrier frequency fc in a frequency demodulation block 9 to obtain signal e. A detecting circuit 6 feeds the audio modulation signal separated from the signal a in a band-pass filter (BPF) 4 and the output signal e of the frequency modulation block 9, accurately detects the cross modulation component $f_1$ contained in the signal e, and controls the frequency demodulation block 9 at control signal h.

Figure 11:
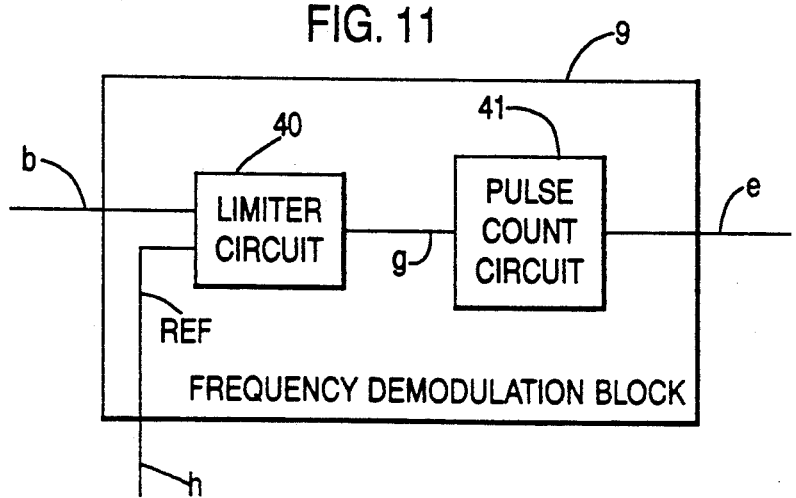
FIG. 11 is a block diagram showing a first embodiment of a frequency demodulation block.
Figure 12:
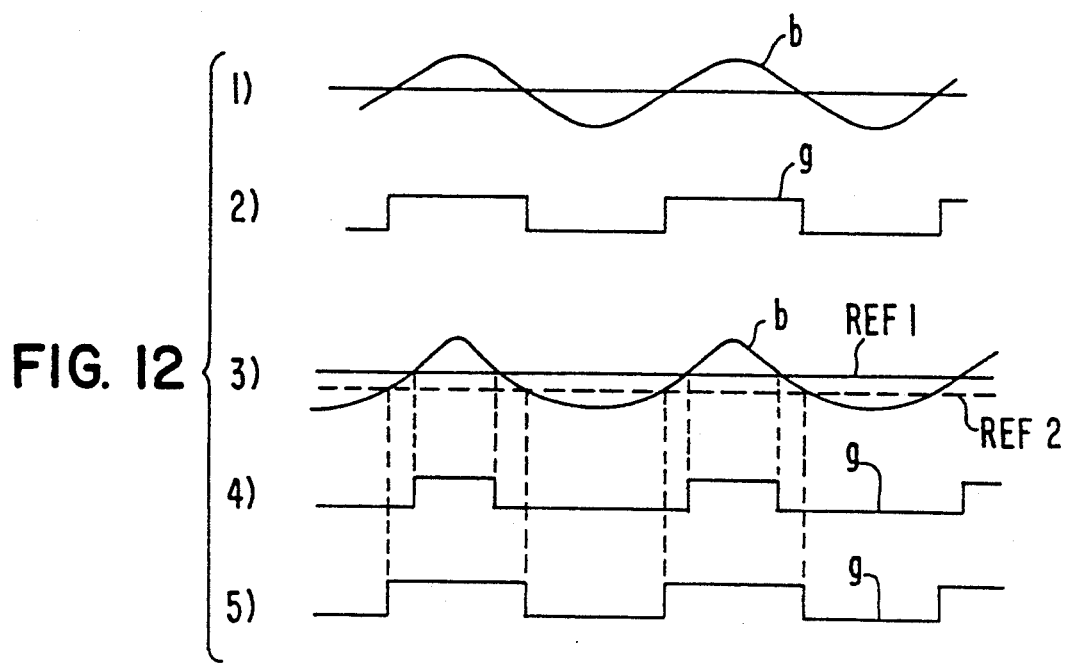
FIG. 12 is a waveform diagram of parts of FIG. 11.

A constitutional example of the frequency demodulation block 9 is shown in FIG. 11. The frequency demodulation block 9 comprises a differential input type limiter circuit 40 and a pulse counter circuit 41. In the differential input type limiter circuit 40, the input signal b is compared with a reference potential ref to actuate the limiter, and generates a square wave having a duty ratio of 1:1 (FIG. 12, 1), 2)). When, however, a secondary distortion is generated, a square wave having a duty ratio of 1:1 is not delivered, and cross modulation interference occurs at this time. This is shown in solid line ref1 in 3) and 4) in FIG. 12. As indicated by broken line ref2 in 3) in FIG. 13, the reference potential ref is changed to an optimum potential. As a result, a square wave having a ratio of 1:1 is obtained as shown in FIG. 12, 5). At this time, the secondary distortion is eliminated, and generation of cross modulation interference may be suppressed.

This reference potential ref is controlled by the control signal h which is the output of the detecting circuit 6. Here, without using the differential input type limiter circuit, the reference potential ref may be fixed, and the control signal h from the detecting circuit 6 may be superposed on the input signal to compose the limiter action, instead. In such a case, the control signal h is in reverse phase of the illustrated example.

Figure 13:
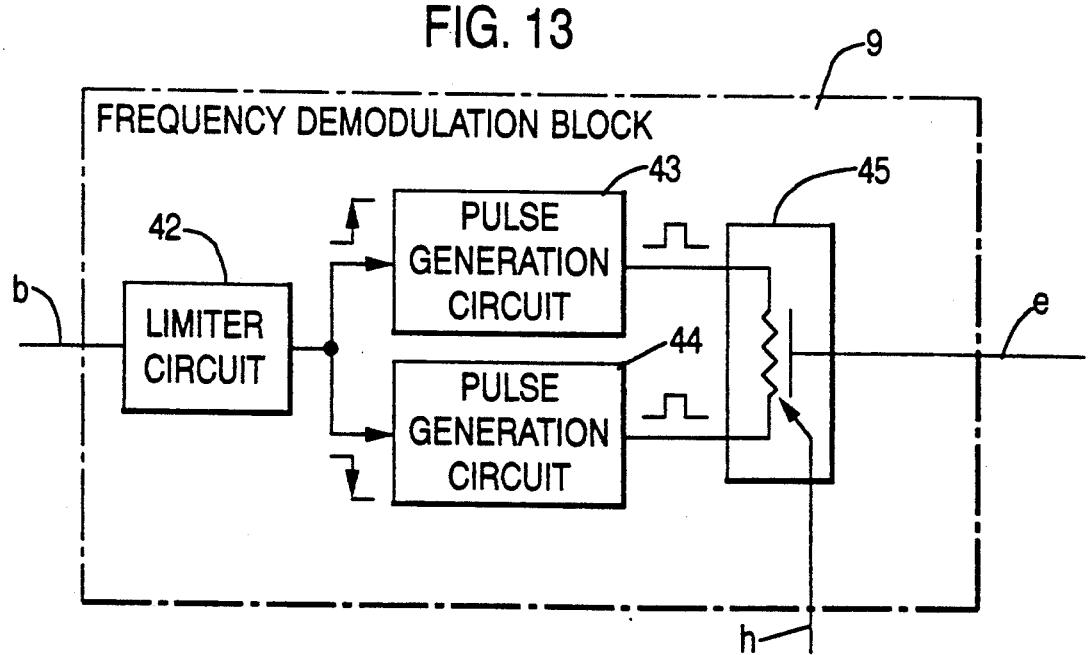
FIG. 13 is a block diagram showing a second embodiment of the frequency demodulation block.

A different composition of the frequency demodulation block 9 is shown in FIG. 13. The frequency demodulation block 9 comprises a limiter circuit 42, a pulse generation circuit 43 for generating a pulse at a leading edge, a pulse generation circuit 44 for generating a pulse at a trailing edge, and an adder circuit 45 for varying the addition ratio of the output signals of the pulse generation circuits 43, 44. When the signal b containing secondary distortion is limited in the limiter circuit 42, the duty ratio of the output of the limiter circuit 42 is no longer 1:1, and if outputs of the pulse generation circuits 43, 44 are merely added at 1:1, secondary distortion is generated. Responsive to properly selecting the addition ratio of the signals from the pulse generation circuits 43, 44, it is possible to suppress the cross modulation components due to secondary distortion. That is, the duty imbalance generated in the limiter due to the secondary distortion is compensated by adjusting the addition ratio, that is, the mixing balance. At this time, generation of cross modulation interference due to secondary distortion is suppressed. Here, by the control signal h which is the output of the detecting circuit 6, the addition ratio of the adder circuit 45 is controlled. The composition and operation of the detecting circuit 6 are as shown in the foregoing embodiments in FIGS. 4, 5, 6.

In the aforementioned embodiment, a phase adjusting circuit for adjusting the phase may be inserted before or after the gain adjusting circuit 5. The synchronous separation circuits 14, 29 may be replaced by circuits for detecting segments free from video signal.

A the timing pulse from the timing generation circuit 30 may be variously considered in the method other than shown in the above embodiment, and, for example, a pair of P3, P4 pulses may be entered in one vertical synchronous signal segment, and the cross modulation component in the vertical synchronous signal segment may be detected.

The inverting circuit 20 and switch circuit 21 may be inserted between the BPF 23 and multiplier 22, and the information of signal e may be inverted in every specified period.

The second cross modulation component $f_1$ is not limited to the audio FM signal, and various other signals may be considered, such as color difference FM signal, low region conversion color signal, pilot signal, and audio digital signal.

The video signal of the first cross modulation wave includes, needless to say, brightness signal, color difference signal, high definition television signal, band compressed signal, etc.

What is claimed is:

1. A signal reproducing apparatus for reproducing a video signal from a recording medium which has recorded therein a mixed signal of a first modulation wave having a video signal frequency-modulated by a carrier frequency fc and a second modulation wave having a second signal modulated in a lower frequency region than said frequency fc, comprising:

reproducing means for reproducing the mixed signal from the recording medium to obtain a reproduced mixed signal;

first filter means for separating the first modulation wave from the reproduced mixed signal;

frequency demodulation means for frequency-demodulating the first modulation wave separated by said first filter means to obtain a demodulated signal, and having cross modulation reducing means for reducing cross modulation interference generated in the demodulated signal;

second filter means for separating the second modulation wave from the reproduced mixed signal; and detecting means for detecting a cross modulation interference component of the second modulation wave remaining in the demodulated signal in a specified period from an output signal of the second filter means and the demodulated signal outputted from the frequency demodulated means, wherein said cross modulation reducing means is responsive to an output signal or said detecting means for reducing the cross modulation interference.

2. A signal reproducing apparatus for reproducing a video signal from a recording medium which has recorded therein a mixed signal of a first modulation wave having a video signal frequency-modulated by a carrier frequency fc and a second modulation wave having a second signal modulated in a lower frequency region than said frequency fc, comprising:

reproducing means for reproducing the mixed signal from the recording medium to obtain a reproduced mixed signal;

first filter means for separating the first modulation wave from the reproduced mixed signal;

frequency demodulation means for frequency-demodulating the first modulation wave separated by said first filter means;

second filter means for separating the second modulation wave from the reproduced mixed signal;

gain adjusting means for adjusting a gain of an output signal of the second filter means;

subtracting means for subtracting an output signal of the gain adjusting means from an output signal of the demodulation means; and detecting means for detecting a second modulation wave component remaining in an output signal of the subtracting means in a specified period from the output signal of the subtracting means and the output signal of the second filter means, wherein said gain adjusting means in responsive to an output signal of said detecting means for adjusting the gain of the output signal of the second filter means so as to remove the second modulation wave component in the output signal of the subtracting means.

3. A signal producing apparatus of claim 2, wherein the specified period of either a horizontal synchronous signal period of a vertical blanking period.

4. A signal reproducing apparatus of claim 2, wherein the detecting means comprises:
- a filter for filtering the second modulation wave component from the output signal of the subtracting means;
- a multiplier for multiplying an output signal of the filter and the output signal of the second filter means;
- a low-pass filter for filtering a low frequency region of an output signal of the multiplier;
- a synchronous separation circuit for separating a horizontal or vertical synchronous signal from the output signal of the subtracting means;
- a sample-hold circuit responsive to an output signal of the synchronous separation circuit for sampling and holding an output signal of the low-pass filter; and
- a comparator for comparing an output signal of the sample-holed circuit with a specific level;
- the gain adjusting means being controlled by output information of the comparator.

5. A signal reproducing apparatus of claim 2, wherein the detecting means comprises:
- inverting means for inverting one of the output signal of the second filter means and the output signal of the subtracting means at specified intervals;
- multiplying means for multiplying an output signal of the inverting means by the other of the output signal of the second filter means and the output signal of the subtracting means; and
- means responsive to an output signal of the multiplying means for controlling the gain adjusting means so as to maintain constant a DC component of the output signal of the multiplying means.

6. A signal reproducing apparatus of claim 2, wherein the detecting means comprises:
- a filter for filtering the second modulation wave component from the output signal of the subtracting means;
- an inverting circuit for inverting a phase of the output signal of the second filter means;
- a switch circuit for alternately selecting the output signal of the second filter means and an output signal of the inverting circuit at intervals of a specified period;
- a multiplier for multiplying an output signal of the switch circuit and an output signal of the filter;
- a first low-pass filter for filtering a low frequency region of an output signal of the multiplier;
- two sample-hold circuits for sampling and holding an output signal for the first low-pass filter alternately at intervals of the specified period;
- a comparator for comparing outputs of the two samplehold circuits with each other;
- a second low-pass filter for filtering a low frequency region of an output signal of the comparator;
- a synchronous separation circuit for separating a horizontal or vertical synchronous signal from the output signal of the subtracting means; and
- a timing generation circuit for generating a timing pulse of the specified period from an output signal of the synchronous separation circuit for controlling the switch circuit and the two sample-hold circuits;
- the gain adjusting means being controlled by an output signal of the second low-pass filter so as to maintain constant a DC level of the output signal of the multiplier.

7. A signal reproducing apparatus of claim 2, wherein the second signal is a frequency-modulated audio signal.

8. A signal reproducing apparatus of claim 2, wherein the second signal is a frequency-modulated color difference signal.

9. A signal reproducing apparatus of claim 2, wherein the second signal is a pilot signal.

10. A signal reproducing apparatus for reproducing a video signal from a recording medium which has recorded therein a mixed signal of a first modulation wave having a video signal frequency-modulated by a carrier frequency fc and a second modulation wave having a second signal modulated in a lower frequency region than said frequency fc, comprising:
- reproducing means for reproducing the mixed signal from the recording medium to obtain a reproduced mixed signal;
- first filter means for separating the first modulation wave from the reproduced mixed signal;
- frequency demodulation means for frequency-demodulating the first modulation wave separated by said first filter means;
- second filter means for separating the second modulation wave from the reproduced mixed signal;
- doubling means for adjusting a frequency of an output signal of the second filter means;
- gain adjusting means for adjusting a gain of an output signal of the doubling means;
- subtracting means for subtracting an output signal of the gain adjusting means from an output signal of the demodulation means; and
- detecting means for detecting a double frequency component of the second modulation wave remaining in an output signal of the subtracting means in a specified period from the output signal of the subtracting means and the output signal of the doubling means, wherein said gain adjusting means is responsive to an output signal of said detecting means for adjusting the gain of the output signal of the doubling means so as to remove the double frequency component of the second modulation wave component in the output signal of the subtracting means.

11. A signal reproducing apparatus of claim 10, wherein the specified period is either a horizontal synchronous signal period or a vertical blanking period.

12. A signal reproducing apparatus of claim 10, wherein the detecting means comprises:
- a filter for filtering the double frequency component of the second modulation wave from the output signal of the subtracting means;
- a multiplier for multiplying an output signal of the filter and the output signal of the doubling means;
- a low-pass filter for filtering a low frequency region of an output signal of the multiplier;

a synchronous separation circuit for separating a horizontal or vertical synchronous signal from the output signal of the subtracting means;

a sample-hold circuit responsive to an output signal of the synchronous separation circuit for sampling and holding an output signal of the low-pass filter; and a comparator for comparing an output signal of the sample-hold circuit with a specified level;

the gain adjusting means being controlled by output information of the comparator.

13. A signal reproducing apparatus of claim 10, wherein the detecting means comprises:

inverting means for inverting one of the output signal of the doubling means and the output signal of the subtracting means at specified intervals;

multiplying means for multiplying an output signal of the inverting means by the other of the output signal of the doubling means and the output signal of the subtracting means; and means responsive to an output signal of the multiplying means for controlling the gain adjusting means so as to maintain constant a DC component of the output signal of the multiplying means.

14. A signal reproducing apparatus of claim 10, wherein the detecting means comprises:

a filter for filtering the double frequency component of the second modulation wave from the output signal of the subtracting means;

an inverting circuit for inverting a phase of the output signal of the doubling means;

a switch circuit for alternately selecting the output signal of the doubling means and an output signal of the inverting circuit at intervals of a specified period;

a multiplier for multiplying an output signal of the switch circuit and an output signal of the filter;

a first low-pass filter for filtering a low frequency region of an output signal of the multiplier;

two sample-hold circuits for sampling and holding an output signal of the first low-pass filter alternately at intervals of the specified period;

a comparator for comparing outputs of the two sample-hold circuits with each other;

a second low-pass filter for filtering a low frequency region of an output signal of the comparator;

a synchronous separation circuit for separating a horizontal or vertical synchronous signal from the output signal of the subtracting means; and a timing generation circuit for generating a timing pulse of the specified period of an output signal of the synchronous separation circuit for controlling the switch circuit and the two sample-hold circuits;

the gain adjusting means being controlled by an output signal of the second low-pass filter so as to maintain constant a DC level of the output signal of the multiplier.

15. A signal reproducing apparatus of claim 10, wherein the second signal is a frequency-modulated audio signal.

16. A signal reproducing apparatus of claim 10, wherein the second signal is a frequency-modulated color difference signal.

17. A signal reproducing apparatus of claim 10, wherein the second signal is a pilot signal.

18. A signal reproducing apparatus for reproducing a video signal from a recording medium which has recorded therein a mixed signal of a first modulation wave having a video signal frequency-modulated by a carrier frequency fc and a second modulation wave having a second signal modulated in a lower frequency region than said frequency fc, comprising:

reproducing means for reproducing the mixed signal from the recording medium to obtain a reproduced mixed signal;

first filter means for separating the first modulation wave from the reproduced mixed signal;

frequency demodulation means for frequency-demodulating the first modulation wave separated by said first filter means, said frequency demodulation means including a limiter balance controllable limiter for limiting the first modulating wave separated by said first filter means;

second filter means for separating the second modulation wave from the reproduced mixed signal;

detecting means for detecting a second modulation wave component remaining in a specified period of an output signal of the frequency demodulation means from the output signal of the frequency demodulation means and an output signal of the second filter means, wherein said limiter in said frequency demodulation means is responsive to an output signal of said detecting means for controlling its limiter balance the output signal of the frequency demodulation means.

19. A signal reproducing apparatus of claim 18, wherein the specified period is either a horizontal synchronous signal period or a vertical blanking period.

20. A signal reproducing apparatus of claim 18, wherein the detecting means comprises:

a filter for filtering the second modulation wave component from the output signal of the frequency demodulation means;

a multiplier for multiplying an output signal of the filter and the output signal and the second filter means;

a low-pass filter for filtering a low frequency region of an output signal of the multiplier;

a synchronous separation circuit for separating a horizontal or vertical synchronous signal from the output signal of the frequency demodulation means;

a sample-hold circuit responsive to an output signal of the synchronous separation circuit for sampling and holding an output signal of the low-pass filter; and a comparator for comparing an output signal of the sample-hold circuit with a specified level;

the limiter balance of said limiter means being controlled by output information of the comparator.

21. A signal reproducing apparatus of claim 18, wherein the detecting means comprises:

inverting means for inverting one of the output signal of the second filter means and the output signal of the frequency demodulation means at specified intervals;

multiplying means for multiplying an output signal of the inverting means by the other of the output signal of the second filter means and the output signal of the frequency demodulation means; and means responsive to an output signal of the multiplying means for controlling the limiter balance of said limiter means so as to maintain constant a DC component of the output signal of the multiplying means.

22. A signal producing apparatus of claim 18, wherein the detecting means comprises:
- a filter for filtering the second modulation wave component from the output signal of the frequency demodulation means;
- an inverting circuit for inverting a phase of the output signal of the second filter means;
- a switch circuit for alternately selecting the output signal of the second filter means and an output signal of the inverting circuit at intervals of a specified period;
- a multiplier for multiplying an output signal of the switch circuit and an output signal of the filter;
- a first low-pass filter for filtering a low frequency region of an output signal of the multiplier;
- two sample-hole circuits for sampling and holding an output signal of the first low-pass filter alternately at intervals of the specified period;
- a comparator for comparing outputs of the two sample-hold circuits with each other;
- a second low-pass filter for filtering a low frequency region of an output signal of the comparator;
- a synchronous separation circuit for separating a horizontal or vertical synchronous signal from the output signal of the frequency demodulation means; and
- a timing generation circuit for generating a timing pulse of the specified period from an output signal of the synchronous separation circuit for controlling the switch circuit and the two sample-hold circuits;
- the limiter balance of said limiter means being controlled by an output signal of the second low-pass filter so as to maintain constant a DC level of the output signal of the multiplier.

23. A signal reproducing apparatus of claim 18, wherein the second signal is a frequency-modulated audio signal.

24. A signal reproducing apparatus of claim 18, wherein the second signal is a frequency-modulated color difference signal.

25. A signal reproducing apparatus of claim 18, wherein the second signal is a pilot signal.

26. A signal reproducing apparatus for reproducing a video signal from a recording medium which has recorded therein a mixed signal of a first modulation wave having a video signal frequency-modulated by a carrier frequency fc and a second modulation wave having a second signal modulated in a lower frequency region than said frequency fc, comprising:
- reproducing means for reproducing the mixed signal from the recording medium to obtain a reproduced mixed signal;
- first filter means for separating the first modulation wave from the reproduced mixed signal;
- frequency demodulation means for frequency-demodulating the first modulation wave separated by said first filter means,
- second filter means for separating the second modulation wave from the reproduced mixed signal; and
- detecting means for detecting a second modulation wave component remaining in an output signal of the frequency demodulation means in a specified period from the output signal of the frequency demodulation means and the output signal of the second filter means,
- wherein the frequency demodulation means comprises a limiter circuit for limiting the first modulation wave separated by said first filter means, a first pulse generation circuit for generating a pulse of a specified width in response to a rising edge of an output signal of the limiter circuit, a second pulse generation circuit for generating a pulse of a specific width in response to a falling edge of the output signal of the limiter circuit, and an adder circuit for adding outputs of the first and second pulse generation circuits at a specific addition ratio, said adder circuit being responsive to an output signal of the detecting means for controlling the addition ratio so as to suppress the second modulation wave component occurring in the output signal of the frequency demodulation means.

27. A signal reproducing apparatus of claim 26, wherein the specified period is either a horizontal synchronous signal period or a vertical blanking period.

28. A signal reproducing apparatus of claim 26, wherein the detecting means comprises:
- a filter for filtering the second demodulation wave component from the output signal of the frequency demodulation means;
- a multiplier for multiplying an output signal of the filter and the output signal of the second filter means;
- a low-pass filter for filtering a low frequency region of an output signal of the multiplier;
- a synchronous separation circuit for separating a horizontal or vertical synchronous signal from the output signal of the frequency demodulation means;
- a sample-hold circuit responsive to an output signal of the synchronous separation circuit for sampling and holding an output signal of the low-pass filter; and
- a comparator for comparing an output signal of the sample-hold circuit with a specified level;
- the addition ratio of the adder circuit of the frequency demodulation means being controlled by output information of the comparator.

29. A signal reproducing apparatus of claim 26, wherein the detecting means comprises:
- inverting means for inverting one of the output signal of the second filter means and the output signal of the frequency demodulation means at specified intervals;
- multiplying means for multiplying an output signal of the inverting means by the other of the output signal of the second filter means and the output signal of the frequency demodulation means, and
- means for responsive to an output signal of the multiplying means for controlling the addition ratio of the adder circuit so as to maintain constant a DC component of the output signal of the multiplying means.

30. A signal reproducing apparatus of claim 26, wherein the detecting means comprises:
- a filter for filtering the second modulation wave component from the output signal of the frequency demodulation means;
- an inverting circuit for inverting a phase of the output signal of the second filter means;
- a switch circuit for alternately selecting the output signal of the second filter means and an output signal of the inverting circuit at intervals of a specified period;
- a multiplier for multiplying an output signal of the switch circuit and an output signal of the filter;

a first low-pass filter for filtering a low frequency region of an output signal of the multiplier;

two sample-hold circuits for sampling and holding an output signal of the first low-pass filter alternately at intervals of the specified period;

a comparator for comparing outputs of the two sample-hold circuits with each other;

a second low-pass filter for filtering a low frequency region of an output signal of the comparator;

a synchronous separation circuit for separating a horizontal or vertical synchronous signal from the output signal of the frequency demodulation means; and a timing generation circuit for generating a timing pulse of the specified period from an output signal of the synchronous separation circuit for controlling the switch circuit and the two sample-hold circuits;

the addition ratio of the adder circuit of the frequency demodulation means being controlled by an output signal of the second low-pass filter so as to maintain constant a DC level of the output signal of the multiplier.

31. A signal reproducing apparatus of claim 26, wherein the second signal is a frequency-modulated audio signal.

32. A signal reproducing apparatus of claim 26, wherein the second signal is a frequency-modulated color difference signal.

33. A signal reproducing apparatus of claim 26, wherein the second signal is a pilot signal.

* * * * *